United States Patent Office 3,380,831

Patented Apr. 30, 1968

3,380,831
PHOTOPOLYMERIZABLE COMPOSITIONS AND ELEMENTS

Abraham Bernard Cohen, Springfield, and Arnold Charles Shoenthaler, East Brunswick, N.J., assignors to E. I. du Pont de Nemours and Company, Wilmington, Del., a corporation of Delaware No Drawing. Filed May 26, 1964, Ser. No. 370,338
7 Claims. (Cl. 96—115)

ABSTRACT OF THE DISCLOSURE

Photopolymerizable compositions comprising (1) a macromolecular organic polymer binder, (2) an addition polymerizable branch chain polyol polyester of an alpha-methylene carboxylic acid of 3–4 carbon atoms, e.g., polyoxyethyltrimethanolpropane triacrylate or trimethacrylate, and polyoxyethylpentaerythritol tetraacrylate or tetramethacrylate, having an average molecular weight from about 450 to about 40,000 and (3) an addition polymerization initiator activatable by actinic radiation and photopolymerizable elements comprising a suport bearing a layer of such composition.

This invention relates to new chemical compounds. More specifically this invention relates to new ethylenically unsaturated, addition polymerizable monomers. This invention also relates to photopolymerizable compositions containing such monomers and to elements embodying the same.

Ethylenically unsaturated monomers capable of addition polymerization are, of course, known. It is also known to incorporate these monomers in photopolymerizable compositions to provide photosensitive systems having a wide range of applications. For example, Plambeck, U.S. 2,760,863 discloses the use of such systems to prepare highly useful relief printing elements for the printing trade. Burg, U.S. 3,060,023 discloses and claims modifications of the same systems for thermal transfer reproduction processes useful in making reproductions of printed matter, engineering drawings, etc.

Photopolymerizable compositions useful in preparing relief printing elements and thermal transfer reproduction elements in general comprise (1) a macromolecular polymer binder, (2) an ethylenically unsaturated monomer capable of addition polymerization and (3) an addition polymerization initiator activatible by actinic radiation. It is also known to combine (1) and (2) in a single polymerizable polymeric compound as disclosed in Burg, U.S. 3,043,805. Generally however, the binder (1) may be any thermoplastic-polymer compound which is solid at 50° C. Nonthermoplastic binders may also be used in room temperature transfer processes after imagewise exposure. The ethylenically unsaturated monomers (2) may be taken from those having at least one and preferably two terminal ethylenic groups, such as esters of the alpha-methylene carboxylic acids, e.g., the bisacrylates and methacrylates of ethylene glycol, diethylene glycol and polyethylene glycols of molecular weights up to 500 or more. Also included are such unsaturated compounds as pentaerythritol acrylates and methacrylates having from two to four acrylyl radicals. These latter compounds, as disclosed in assignee's Celeste et al. Ser. No. 274,909, filed Apr. 23, 1963, now Patent No. 3,261,686, offer several advantages over the alpha-methylene carboxylic acid esters of polyethylene glycol. The reason is that the glycol esters have a high plasticizing action on the macromolecular polymer binder. Because of this plasticizing action, these monomeric esters produce, at the desired concentration for adequate photographic speed, a photopolymerizable printing plate composition that is lacking in hardness. In thermal transfer elements, these monomers produce copies having a tendency toward high background stain. The compounds of the above Celeste and Seide application overcome some of the disadvantages of the plasticizing action of the earlier monomers and improve the fidelity of the relief images and thermal transfer copies. However, all of the above compounds leave something to be desired in their function as satisfactory, addition polymerizable monomers in photopolymerizable systems. Many of the above monomers must be incorporated in the photosensitive composition and coated from organic solvent solutions. Many of the above monomers readily absorb oxygen which acts as a powerful inhibitor polymerization thus lowering the radiation sensitivity of the system. Because of this, the elements have lower photographic speed and do not reproduce the halftones with satisfactory fidelity. This poor rendition of halftones may be explained by the fact that there is a great difference in the explosure pattern between highlight and shadow areas of the copying element and the fact that oxygen is a mobile inhibitor. In the shadow areas of a halfton the image element is a small dot getting full exposure in an unexposed surround which may comprise 98% of the total area. Before polymerization can occur, the oxygen in this image must be consumed by photoinitiated reactions. During this process, more oxygen diffuses into the areas being exposed from adjacent unexposed areas, thus increasing the exposure required for polymerization. In the highlight areas, the image element is a small unexposed dot (as small as 2% in an exposed surround. Therefore the amount of oxygen available for inhibiting the polymerization and thus lengthening the exposure is relatively negligible. The net result is that shadow areas require a longer exposure time for faithful reproduction than the highlight areas. The greater the oxygen concentration, the greater this difference and the narrower the range of halftones which any given exposure can reproduce without special techniques. Such techniques include conditioning the photosensitive element in an atmosphere which removes a substantial amount of absorbed oxygen before exposure and substantially excluding oxygen from contact with the element by means of an impervious film in the manner taught by asignee's Heiart U.S. Patent 3,060,026.

One significant disadvantage of the foregoing unsaturated monomeric compounds is their unfavorable biochemical activity. Because of the relatively simple structure and low molecular weight in relation to their degree of unsaturation they are highly soluble in oils and readily permeate the skin and react unfavorably with tissues and body fluids. This requires a considerable amount of care in the manufacture and use of the photosensitive polymerization inhibiting oxygen. A further object is to order to avoid toxicity and allergenic effects.

It is an object of this invention to prepare new chemical compounds. It is a further object to prepare new and useful ethylenically unsaturated addition polymerizable monomeric compounds. It is a still further object to prepare such monomeric compounds which have little or no toxicologic action. A still further object is to produce such monomers which have a low capacity for dissolving polymerization inhibiting oxygen. A further object is to produce ethylenically unsaturated addition polymerizable monomers possessing a high degree of sensitivity to photoinitiated polymerization. A further object is to produce such monomers which are water-soluble or completely miscible therewith. A further object is to provide highly useful photopolymerizable compositions and photosensitive elements prepared therewith. Other objects will be apparent from the following description of the invention.

It has now been found that the disadvantages of the prior art monomers can be overcome by increasing the molecular size and cross-section area of the molecules of ethylenically unsaturated addition polymerizable acrylate monomers. Intermediates are prepared by condensing ethylene or propylene oxide with tri- or polyhydric low molecular weight alcohols resulting in a branched polyol having repeating ether units and a large cross-sectional area. The general synthesis for these intermediates is disclosed in N. G. Gaylord, ed., "Polyethers," Part I, Interscience Publishers, New York, N.Y. (1962). The addition polymerizable compounds of this invention are then made by esterification of branched polyols with acrylic or methacrylic acid. The presence of the ether group as a repeating unit renders the monomers hydrophilic and less soluble in oils. This in turn reduces skin diffusion resulting in lower toxicity.

The branched chain polyol polyether polyesters of alpha-methylene carboxylic acids of 3–4 carbons contain the three radicals represented by the formula $$\left[HO-(\underset{Q}{\underset{|}{C}}HCH_2O)_m-\right]_z \quad C_xH_{(2x+2-y-z)} \quad \left[-(OCH_2\underset{Q}{\underset{|}{C}}H)_n-O\underset{O}{\underset{\|}{C}}-\underset{R}{\underset{|}{C}}=CH_2\right]_y$$

free hydroxyl chain end; polyhydric alcohol carbon skeleton; alkylene oxide chain extender; addition polymerizable ester chain end wherein $Q$ is H, $CH_3$ or $C_2H_5$,
$R$ is H or $CH_3$,
$x$ is 3, 4, 5 or 6 and is equal to or greater than $y+z$,
$y$ is 2, 3, 4, 5 or 6,
$z$ is 0, 1, 2, 3 or 4 and $y+z$ is greater than 2,
$m$ is 0, 1 or more, and
$n$ is 1 or more.

The polyhydric alcohol skeleton may be derived from such compounds as trimethylolpropane, glycerol, the pentitols, e.g., pentaerythritol; and the hexitols, e.g., d-mannitol and d-sorbitol. Other polyfunctional compounds capable of reaction with alkylene oxides may be used. Ethylene oxide and propylene oxide may be used as chain extenders and also as chain terminators containing free hydroxyl groups. Acrylic acid and methacrylic acid are suitable alpha-methylene carboxylic acids for providing addition polymerizable ester chain ends.

The general synthetic route for making the novel monomeric compounds may be outlined as follows:

(1) Chain extension $$C_xH_{(2x+2-y-z)}(OH)_{y+z} + (ny+mz)(\underbrace{CH_2—\overset{Q}{\overset{|}{C}}H}_{O}) \longrightarrow$$

$$C_xH_{(2x+2-y-z)}[(OCH_2—\underset{Q}{\underset{|}{C}}H)_nOH]_y[(OCH_2\underset{Q}{\underset{|}{C}}H)_mOH]_z$$

(2) Chain esterification $$C_xH_{(2x+2-y-z)}[(OCH_2—\underset{Q}{\underset{|}{C}}H)_nOH]_y[(OCH_2—\underset{Q}{\underset{|}{C}}H)mOH]_z +$$

$$y(CH_2=\underset{R}{\underset{|}{C}}—COOH) \longrightarrow$$

$$C_xH_{(2x+2-y-z)}[(OCH_2\underset{Q}{\underset{|}{C}}H)_n—O\underset{O}{\underset{\|}{C}}—\underset{R}{\underset{|}{C}}=CH_2]_y[(OCH_2\underset{Q}{\underset{|}{C}}H)_mOH]_z$$

The reactions are carried out in accordance with methods known to those skilled in the art.

The compounds resulting from the above reactions may be used to prepare the relief printing elements described in Plambeck U.S. 2,791,504. They may also be used in the processes using thermal transfer reproduction elements as described in Burg et al. U.S. 3,060,023; U.S. 3,060,024; U.S. 3,060,025 and Heiart U.S. 3,060,026. They are also useful in reproduction processes involving imagewise exposure and transfer at room temperature. The monomers are compatible with many useful binders described in the above patents and provide a good balance of photographic speed and plasticity to the photopolymerizable layers.

Particularly useful monomers of the above class are: the triacrylate ester of the reaction product of trimethylolpropane and ethylene oxide, trimethacrylate ester of the reaction product of trimethylolpropane and ethylene oxide, the triacrylate ester of the reaction product of trimethylolpropane and propylene oxide and the tetraacrylate and tetramethacrylates of the reaction products of ethylene oxide and propylene oxide with pentaerythritol. The reaction products preferably have an average molecular weight from about 450 to about 40,000.

The invention is further illustrated by, but is not intended to be limited to the following examples wherein parts and percentages are by weight.

Example I.—Triacrylate of oxyethylated trimethylolpropane (A) *Preparation.*—The following mixture was refluxed 15½ hours under a condenser fitted with an azeotropic separator:

1200 g. of oxyethylated trimethylolpropane of average molecular weight 1040 made in the manner described in "Polyethers," Part I, Interscience Publishers, New York, N.Y. (N. G. Gaylord, ed.),
310 g. of glacial acrylic acid containing 0.1% p-methoxyphenol as a polymerization inhibitor,
600 ml. of benzene,
6.0 ml. of conc. sulfuric acid (1.84 s.g.), and
1.5 g. of cuprous oxide.

During this time there was collected 62 ml. (100% of theory) of water.

The reaction mixture was cooled, diluted with 2000 ml. of benzene then extracted with two 600 ml. portions of 20% sodium chloride, two 600 ml. portions of 24% potassium bicarbonate, then 600 ml. of 20% sodium chloride. The organic extract was clarified by stirring with 180 g. of diatomaceous earth, filtering, then storing over anhydrous calcium sulfate overnight.

A 500-ml. portion of the anhydrous extract was purified by passing it through a 38 mm. x 60 cm. column of 48-mesh activated alumina. After adding 0.10 g. of p-methoxyphenol, the purified solution was concentrated at aspirator pressure and an oil bath temperature of 50–60° to give 128 g. of viscous, water-white oil, $N_D^{25}=1.4712$. Toxicological tests indicated that the toxicity of this monomer is of the order of ⅕ of that of pentaerythritol triacrylate, and is of the order of 1/15 of that of triethylene glycol diacrylate.

(B) *Direct positive thermal transfer copy film.*—The following mixture was ball-milled 16 hours in a glass jar with ⅜" ceramic balls:

1.50 g. of the triacrylate just described,
6.00 g. of a 25% solution of poly (methyl methacrylate) having a molecular weight of about 20,000–50,000 in benzene,
2.00 g. of a 15% dispersion of carbon black in isopropanol (obtained from the Columbian Carbon Co. under the name "Alcoblak 313"),
0.20 g. of 2-t-butylanthraquinone, and
acetone to a total weight of 20 g.

The resulting composition was then coated on 0.004-inch thick polyethylene terepthalate film base made as described in Example I of Alles et al. U.S. 2,779,684 using a 0.006-inch clearance doctor knife.

After air drying overnight the coating was laminated to untreated 0.001-inch polyethylene terephthalate film between heated, pressure loaded, mechanically driven rolls. The roll temperature was 100° C., the pressure 58 lbs./in., (lineal) and the web speed 2 ft./min.

This film was exposed for one minute in contact with a positive transparency 16 inches from a 65-ampere 3300-watt carbon arc. The 0.001-inch cover sheet was removed and the image areas (unexposed) on the coating transferred from the 0.004-inch support to paper with the same device and conditions used to laminate the cover sheet. The paper and coating were separated immediately as they left the nip; the exposed polymerized areas were no longer plastic and adhesive and did not transfer under these conditions. A positive copy of the original transparency was thus obtained on the paper receptor sheet.

The same procedure was repeated except the thermal transfer was made to a matte surface of a polyethylene terephthalate drafting film made as described in Example I of Van Stappen U.S. 2,964,423 issued Dec. 13, 1960.

(C) *Direct positive copying film developed by room temperature delamination.*—The following mixture was ball milled for 3 days in a glass jar with ⅜" ceramic balls:

3.50 g. of the triacrylate described above,
12.0 g. of a 25% solution of the poly(methyl methacrylate) (Example I) in methyl ethyl ketone,
4.0 g. of a 15% dispersion of carbon black in isopropanol (obtained from the Columbian Carbon Co. under the name "Alcoblak 313"),
0.40 g. of 9,10-phenanthrenequinone, methyl ethyl ketone to 40 g.

The resulting composition was coated on 0.001-inch polyethylene terephthalate film using a doctor knife with a 0.002-inch clearance.

After air drying overnight, the coating was laminated to the matte surface of the drafting film described under (B) above.

This film was exposed for 2 minutes through a positive transparency with the carbon arc exposing device described above. When the .001 inch polyethylene terephthalate film was stripped off, a positive image consisting of unexposed, unpolymerized matrix was left on the drafting film. A negative image of exposed, polymerized matrix adhered to the film that was stripped off. Exposure, i.e., polymerization, reverses the relative adhesion the matrix has for the thin, clear, polyester sheet and the matte surface drafting film.

Delamination gave a positive copy on the latter.

Example II.—Triacrylate of oxyethylated trimethylolpropane (A) *Preparation.*—The monomer preparation procedure (A) described in Example I was repeated using:

609 g. of oxyethylated trimethyolopropane of average molecular weight 609,
270 g. of glacial acrylate acid containing 0.1% p-methoxyphenol,
300 ml. of benzene,
3.0 ml. of conc. sulfuric acid (1.84 s.g.), and
0.75 g. of cuprous oxide.

During 13 hours, there was collected 54 ml. (100% of theory) of water. The reaction mixture was extracted and clarified as in Example I using proportionate amounts of materials. Concentration at reduced pressure in the presence of 0.4 g. of p-methoxyphenol left 707 g. of viscous pale yellow oil $N_D^{25}$=1.4722. The material was purified by dissolving 100 g. in 100 ml. of acetone and passing the solution through a column of activated alumina.

(B) *Direct positive thermal transfer copy film.*—A copy film was prepared exactly as in Example I–B except for the use of 1.50 g. of the triacrylate, just described, in place of the triacrylate of Example I. It gave positive copies of transparencies when exposed and developed by thermal transfer as in Example I–B.

(C) *Letterpress printing plate.*—The following mixture was cast in a 6" x 9" dammed area on an adhesive coated aluminum support:

42 g. of cellulose acetate/hydrogen succinate in: 200 ml. acetone and 10 ml. methanol,
20 g. of the triacrylate monomer of Preparation A,
0.06 g. of p-methoxyphenol,
0.07 g. of 2-ethylanthraquinone.

After slow air drying (to a thickness of approximately .030 inch), the plate was conditioned in a carbon dioxide atmosphere overnight and exposed 90 sec. in contact with a negative process transparency 30 inches from a 140-amp. carbon arc. Spray development with 0.04 N sodium hydroxide washed away the unexposed areas and left the exposed, polymerized part as a relief image suitable for letterpress printing. The relief image showed faithful reproduction with good modulation from the shadow areas to the highlights. There was no indication of imbalance in the formation of halftone dots.

Example III.—Trimethacrylate of oxyethylated trimethylolpropane (A) *Preparation.*—The procedure described in Example II was repeated using:

596 g. of oxyethylated trimethylolpropane average molecular weight 596,
285 g. of glacial methacrylic acid containing 0.025% p-methoxyphenol
300 ml. of benzene
7.5 ml. of conc. sulfuric acid (1.84 s.g.),
0.38 g. of cuprous oxide, and
0.28 g. of p-methoxyphenol.

The stirrer and thermometer in the reaction flask were wound with copper wire to provide further protection against thermal polymerization. After 6 hours' reflux, there was removed 49 ml. (90% of theory) of water. The reaction mixture was extracted and clarified as in Example I, using proportionate amounts of materials. The dry extract was purified by chromatography over activated alumina and concentrated at reduced pressure to yield 291 g. of straw yellow oil, $N_D^{25}$=1.4695.

(B) *Direct positive thermal transfer copy film.*—A copy film was prepared exactly as in Example I–B (except for 48 hrs. milling time) using the following materials:

3.30 g. of the trimethacrylate monomer of preparation A,
12.0 g. of a 25% solution of the poly(methylmethacrylate) of Example I in trichloroethylene,
4.00 g. of a 15% dispersion of carbon black in isopropanol (obtained from the Columbian Carbon Co. under the name "Alcoblak 313"),
0.40 g. of 2-ethylanthraquinone,
acetone to 40 g.

Exposure of this film to a positive transparency for one minute in the carbon arc exposing device used in Example I–B gave an image which could be thermally transferred to paper.

(C) *Influence of film oxygen content on photospeed and halftone dot quality.*—This film was compared with one exactly the same except for the use of the low molecular weight monomer: trimethylolpropane trimethacrylate.

The relative ability of these films to reproduce halftones was tested by exposing them to a 150-line halftone transparency having thirteen areas or "steps" ranging in dot coverage from 5% to 95%.

Adjusting the exposure to just reproduce the 5% step, the film with oxyethylated trimethylolpropane trimethacrylate-600 required two minutes and reproduced eleven steps, i.e., from 5% to 78%. The trimethylolpropane trimethacrylate film required eight minutes' exposure and reproduced only nine steps, i.e., from 5% to 66% dot coverage.

Example IV.—Triacrylate of oxyethylated trimethylolpropane (A) *Preparation*.—The procedure described in Example I was repeated except for using:

1200 g. of oxyethylated trimethylolpropane of average molecular weight 1550,
209 g. of glacial acrylic acid (containing 0.1% p-methoxyphenol).

In 15½ hours there was collected 40 ml. (95% of theory) of water. Concentration of the purified extract gave 98 g. of very viscous water-white oil, $N_D^{25}=1.4707$.

(B) *Direct positive thermal transfer copy film*.—A film was prepared from this monomer exactly as in Example I–B. Under the same exposure and thermal transfer conditions, good legible copies on paper and matte surface drafting film were made.

Example V.—Triacrylate of oxypropylated trimethylolpropane (A) *Preparation*.—The procedure described in Example I was repeated using:

178 g. of oxypropylated trimethylolpropane of average molecular weight 740,
68 g. of glacial acrylic acid containing 0.1% p-methoxyphenol,
90 ml. of benzene,
1.0 ml. of conc. sulfuric acid (1.84 s.g.) and
0.10 g. of cuprous oxide.

In 10½ hours, 13.7 ml. (100% of theory) of water was collected. After diluting with 350 ml. of benzene the mixture was extracted, clarified, and concentrated in the usual way to give 140 g. of pale greenish viscous oil. The color (copper salts) was removed by redissolving the crude product in benzene and percolating it over activated alumina. Concentration gave a water while viscous oil, $N_D^{25}=1.4555$.

(B) *Direct positive thermal transfer copy film*.—A film was made exactly as in Example I–B except that 4.35 g. of the monomer of Preparation A of this example was used, and the amounts of the other ingredients in the coating composition were doubled. Using the same exposure and thermal transfer conditions, good, clear copies on paper and matte surface drafting film were made.

Example VI.—Tetraacrylate of oxypropylated pentaerythritol (A) *Preparation*.—The procedure described in Example I was repeated using:

388 g. of oxypropylated pentaerythritol of average molecular weight 620,
225 g. of glacial acrylic acid containing 0.1% p-methoxyphenol, 194 ml. of benzene,
3.1 ml. of conc. sulfuric acid (184 s.g.) and
0.31 g. of cuprous oxide.

In 10½ hours, 45 ml. (100% of theory) of water was collected. After diluting with 800 ml. of benzene, the mixture was extracted, clarified and concentrated in the usual way to give 413 g. of faintly greenish viscous oil. The color was removed by percolating a benzene solution of the crude monomer over activated alumina. Concentration left a water white viscous oil, $N_D^{25}=1.4609$.

(B) *Direct positive thermal transfer copy film*.—A film was made exactly as in Example I–B except that 4.50 g. of this monomer was used, and the amounts of the other ingredients in the coating composition were doubled. With the same exposure and thermal transfer conditions, good copies on paper and matte surface drafting film were made.

Example VII.—Tetraacrylate of oxyethylated pentaerythritol (A) *Preparation*.—The procedure described in Example I was repeated useing:

800 of oxyethylated pentaerythritol of average molecular weight 1210,
240 g. of glacial acrylic acid containing 0.1% p-methoxyphenol,
400 ml. of benzene,
2.67 ml. of conc. sulfuric acid (184 s.g.), and
0.33 g. of cuprous oxide.

In 18 hours, there was collected 42.5 ml. (89% of theory) of water. After dilution with 1500 ml. of benzene, the mixture was extracted, clarified and concentrated in the usual way to give 741 g. of viscous yellow oil, $N_D^{25}=1.4763$.

(B) *Direct positive thermal transfer copy film*.—A film was made exactly as in the Example I–B except that 3.45 g. of this monomer was used, and the amounts of the other ingredients in the coating composition were doubled. With the same exposure and thermal transfer conditions, good copies on paper and matte surface drafting film were made.

Example VIII.—Tetraacrylate of oxyethylated pentaerythritol (A) *Preparation*.—The procedure of Example I was repeated using:

845 g. of oxyethylated pentaerythritol of average molecular weight 1690,
180 g. of glacial acrylic acid inhibited with 0.1% p-methoxyphenol,
432 ml. of benzene,
250 ml. of conc. sulfuric acid (1.84 s.g.) and
0.25 g. cuprous oxide.

In 18 hours reflux, 32.5 ml. (90% of theory) of water was collected. After dilution with 1500 ml. of benzene, the mixture was extracted, clarified and concentrated in the usual way to give 462 g. of straw yellow viscous oil, $N_D^{25}=1.4745$.

(B) *Direct positive thermal transfer copy film*.—A film was made exactly as described in the previous example. Using the same exposure and thermal transfer conditions as in Example I–B, good copies on paper and matte surface drafting film were made.

The photopolymerizable compositions, for a thermal transfer process and embodying the above monomers comprise:

(1) a thermoplastic macromolecular organic polymer solid at 50° C.

(2) at least one of the monomers defined above
(3) an addition polymerization initiator activatable by actinic radiation (e.g., of wavelength from 200 to 700 $m\mu$) and, if desired,
(4) an addition polymerization inhibitor.

The foregoing constituents can be present in the respective amounts, by weight, as follows:

(1) 10 to 99
(2) 99 to 5
(3) 0.001 to 20
(4) 0.001 to 2

Photopolymerizable elements utilizing the above compositions comprise a stratum and a support, said stratum being solid below 40° C., and capable on exposure of providing (1) image areas (underexposed) which are thermally transferable by having a flow, stick, or transfer temperature above 40° C. and below 220° C., comprising the constituents (1)–(4) described above. The thermal transfer process of reproduction comprises pressing the surface of said stratum into contact with the image-receptive surface of a separate element, heating at least one of said elements to a temperature of at least 40° C., and separating the two elements whereby the thermally transferable unexposed image areas of said stratum transfer to said image-receptive element. Suitable apparatus which can be used for photothermographic transfer are disclosed in assignee's U.S. applications of Helart and Velvel Ser. No. 234,616 filed Nov. 1, 1962 now Patent No. 3,211,074 and corresponding Belgian Patent No. 639,445, Nov. 14, 1963, and Cohen Ser. No. 250.856 filed Jan. 11, 1963, now abandoned.

Photopolymerizable layers of the elements for either thermal transfer processes or room temperature reproduction processes generally are 0.00001 to 0.005 preferably 0.0001 to 0.001 inch in thickness. The thickness of the photopolymerizable layers for making printing reliefs in the manner of Plambeck, U.S. 2,791,504 are about 0.003 to 0.25 inch and preferably 0.010 to 0.040 inch.

The receptor support to which the image is transferred must also be stable at the process temperatures. The particular support used is dependent on the desired use for the transferred image and on the adhesion of the image to the base. Suitable supports are paper, including bond paper, resin and clay-sized paper, resin-coated or impregnated paper, cardboard, metal sheets, foils, and meshes e.g., aluminum, copper, steel, bronze, etc.; wood, glass, nylon, rubber, polyethylene linear condensation polymers such as the polyesters e.g., polyethylene terephthalate, regenerated cellulose, cellulose esters e.g., cellulose acetate, silk, cotton, and viscose rayon fabrics or screens.

Suitable thermoplastic polymers for use as components (1) include: copolyesters, e.g., those prepared from the reaction product of a polymethylene glycol of the formula $HO(CH_2)_nOH$, wherein $n$ is a whole number 2 to 10 inclusive, and (1) hexahydroterephthalic, sebacic and terephthalic acids, (2) terephthalic, isophthalic and sebacic acids, (3) terephthalic and sebacic acids, (4) terephthalic and isophthalic acids, and (5) mixtures of copolyesters prepared from said glycols and (i) terephthalic, isophthalic and sebacic acids and (ii) terephthalic, isophthalic, sebacic and adipic acids, (b) nylons or polyamides, e.g., N-methoxymethyl polyhexamethylene adipamide; (c) vinylidene chloride copolymers, e.g., vinylidene chloride/acrylonitrile; vinylidene chloride/methlacrylate and vinylidene chloride/vinylacetate copolymers; (d) ethylene/vinyl acetate copolymer; (3) cellulosic ethers, e.g., methyl cellulose, ethyl cellulose and benzyl cellulose; (f) polyethylene, (g) synthetic rubbers, e.g., butadiene/acrylonitrile copolymers, and chloro-2-butadiene-1,3 polymers; (h) cellulose esters, e.g., cellulose acetate, cellulose acetate succinate and cellulose acetate butyrate; (i) polyvinyl esters, e.g., polyvinyl acetate/acrylate, polyvinyl acetate/methacrylate and polyvinyl acetate; (j) polyacrylate and alpha-alkyl polyacrylate esters, e.g., polymethyl methacrylate and polyethyl methacrylate; (k) high molecular weight polyethylene oxides of polyglycols having average molecular weights from about 4,000 to 1,000,000; (l) polyvinyl chloride and copolymers, e.g., polyvinyl chloride/acetate; (m) polyvinyl acetal, e.g., polyvinyl butyral, polyvinyl formal; (n) polyformaldehydes; (o) polyurethanes; (p) polycarbonates; (q) polystyrenes.

In addition to the plasticizer which can be added to the thermoplastic polymer constituent of the photopolymerizable composition there can be added non-thermoplastic polymeric compounds to give certain desirable characteristics, e.g., to improve adhesion to the base support, adhesion to the receptor support on transfer, wear properties, chemical inertness, etc. Suitable non-thermoplastic polymeric compounds include polyvinyl alcohol, cellulose, anhydrous gelatin, phenolic resins and melamine-formaldehyde resins, etc. If desired, the photopolymerizable layers can also contain immiscible polymeric or non-polymeric organic or inorganic fillers or reinforcing agents, e.g., the organophilic silicas, bentonites, silica, powdered glass, colloidal carbon, as well as various types of dyes and pigments, in amounts varying with the desired properties of the photopolymerizable layer. The fillers are useful in improving the strength of composition, reducing tack and in addition, as coloring agents.

The addition polymerizable ethylenically unsaturated compounds for use as components (2) are taken from the monomers herein described and may also include mixtures of these monomers and minor amounts of other polymerizable compounds known to the prior art may be added for special purposes. The amount of these monomers added will, of course, vary with the particular thermoplastic polymers used.

A preferred class of addition polymerization initiators (3) activatable by actinic light and thermally inactive at and below 185° C. includes the substituted or unsubstituted polynuclear quinones which are compounds having two intracyclic carbonyl groups attached to intracyclic carbon atoms in a conjugated six-membered carbocyclic ring, there being at least one aromatic carbocyclic ring fused to the ring containing the carbonyl groups. Suitable such initiators include 9,10-anthraquinone, 1-chloroanthraquinone, 2-chloroanthraquinone, 2-methylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2,3-diphenylanthraquinone, sodium salt of anthraquinone, alphasulfonic acid, 3-chloro-2-methylanthraquinone, retenequinone, 7,8,9,10-tetrahydronaphthacenequinone, and 1,2,3,4-tetrahydrobenz (a)anthracene-7,12-dione. Other photo-initiators which are also useful are described in Plambeck U.S. Patent 2,760,863 and include vicinal ketaldonyl compounds, such as diacetyl, benzil, etc.; α-ketaldonyl alcohols, such as benzoin, pivaloin, etc; acyloin ethers, e.g., benzoin methyl and ethyl ethers, etc.; α-hydrocarbon substituted aromatic acyloins, including α-methylbenzoin, α-allylbenzoin and α-phenylbenzoin.

Suitable thermal polymerization inhibitors (4) that can be used in addition to the preferred p-methoxy-phenol include hydroquinone, and alkyl and aryl-substituted hydroquinones and quinones, tert-butylcatechol, pyrogallol, copper resinate, naphthylamines, beta-naphthol, cuprous chloride, 2,6-di-tert-butyl p-cresol, phenothiazine, pyridine, nitrobenzene and dinitrobenzene. Other useful inhibitors include p-toluquinone and chloranil.

Various dyes, pigments, hermographic compounds and color-forming components can be added to the photopolymerizable composition to give varied results after the thermal transfer. These additive materials, however, preferably should not absorb excessive amounts of light at the exposure wave length or inhibit the polymerization reaction.

Among the dyes useful in the invention are Fuchsine (C.I. 42510), Auramine Base (C.I. 4100B), Calcocid Green S (C.I. 44090), Para Magenta (C.I. 42500), Tryparoson (C.I. 42505), New Magenta (C.I. 42520), Acid Violet RRH (C.I. 42425), Red Violet 5RS (C.I. 42690), Nile Blue 2B (C.I. 51185), New Methylene Blue GG (C.I. 51195), C.I. Basic Blue 20 (C.I. 42585), Iodine Green (C.I. 42556), Night Green B (C.I. 42115), C.I. Direct Yellow 9 (C.I. 19540), C.I. Acid Yellow 17 (C.I. 18965), C.I. Acid Yellow 29 (C.I. 18900), Tartrazine (C.I. 19140), Supramine Yellow G (C.I. 19300), Buffalo Black 10B (C.I. 27790), Naphthalene Black 12R (C.I. 20350), Fast Black L (C.I. 51215), Ethyl Violet (C.I. 42600), Pontacyl Wool Blue BL (C.I. 50315), and Pontacyl Wool Blue GL (C.I. 50320) (numbers obtained from the second edition of Color Index).

Suitable pigments, useful thermographic additives and suitable color forming components are listed in Burg and Cohen U.S. Patent 3,060,023.

The photopolymerizable composition is preferably coated on a base support. Suitable support materials are stable at the heating temperatures used in the instant invention. Suitable bases or supports include those disclosed in U.S. Patent 2,760,863, glass, wood, paper, cloth, cellulose esters e.g., cellulose acetate, cellulose propionate, cellulose butyrate, etc., and other plastic compositions such as polyolefins e.g., polypropylene. The support may have in or on its surface and beneath the photoploymerizable stratum an antihalation layer as disclosed in said patent or other substrata needed to faciltate anchorage to the base.

The supports can have an anti-blocking or release coating, e.g., finely divided inert particles in a binder such as silica in gelatin.

As has been shown the compounds of the class herein described posses the needed qualities to give improved photopolymerizable compositions. Photopolymerizable compositions containing the novel monomers have higher photographic speed and reproduce halftones better than pohtopolymerizable compositions containing acrylate and methacrylate esters of simple alcohols. This is believed due to the characteristic of the novel monomers of dissolving less oxygen. Another advantage of the novel monomers is their greater water solubility or miscibility, particularly, the oxyethylated compounds. Those with molecular weights of 1000 or higher are completely miscible in water. This property is important in formulting elements which can be coated from aqueous systems. It is also important in obtaining best performance from products which depend on aqueous treatments for image development. Another advantage which stems from the ether linkages and relatively large molecular cross-sectional area of the monomer in relation to the degree of unsaturation is the lower toxicity. This substantially reduces or obviates hazards to health in handling the compositions during manufacture and use. Also, because of the relatively larger molecular weight of the molecule, the novel monomers have extremely low vapor pressure, even at elevated temperatures. Exposure to vapors is thus negligible even when the compositions are used in the thermal transfer processes described above. Another advantage is that the monomers of this invention, even in the higher molecular weight range are liquids. This is due to branching chains and provides them with better compatibility with the thermoplastic binders needed to formulate the photopolymerizable compositions than is the case with straight chain polyethylene glycol diacrylate monomers of the same molecular weight. The latter are solids and are crystalline. This characteristic causes undesirable defects in photopolymerizable coatings. A further advantage is that the photopolymerizable layers and elements having high contrast and good speed can be obtained using the novel monomers of this invention.

What is claimed is:

1. A photopolymerizable composition comprising (1) a macromolecular organic polymer binder solid at 50° C., (2) an addition polymerizable, branched chain polyol polyester of an alpha-methylene carboxylic acid of 3–4 carbon atoms represented by the formula $$\left[HO\text{-}(\underset{Q}{C}HCH_2O)_m\text{-}\right]_z \quad C_xH_{(2x+2-y-z)} \quad \left[\text{-}(OCH_2\underset{Q}{C}H)_n\text{-}O\overset{O}{\overset{\|}{C}}\text{-}\underset{R}{C}{=}CH_2\right]_y$$

free hydroxyl chain end | polyhydric alcohol carbon skeleton | alkylene oxide chain extender | addition polymerizable ester chain end wherein Q is a member selected from the group consisting of H, $CH_3$ and $C_2H_5$, R is a member selected from the group consisting of H and $CH_3$, $x$ is a cardinal number selected from the group consisting of 3, 4, 5 and 6, being equal to or greater than $y+z$, $y$ is a cardinal number selected from the group consisting of 2, 3, 4, 5 and 6, $z$ is a cardinal number selected from the group consisting of 0, 1, 2, 3 and $y+z$ is greater than 2, $m$ is a cardinal number selected from the group consisting of 0, 1 and more, $n$ is a cardinal number selected from the group consisting of 1 and more, said polyesters being further characterized in that $ny+mz$ is greater than 6 but not greater than 500, and (3) an addition polymerization initiator activatable by actinic radiation.

2. A composition according to claim 1 wherein the polyester is a polyoxyethyltrimethylolpropane triacrylate having an average molecular weight from about 450 to about 40,000.

3. A composition according to claim 1 wherein the polyester is a polyoxyethyltrimethylolpropane trimethacrylate having an average molecular weight from about 450 to 40,000.

4. A composition according to claim 1 wherein the polyester is a polyoxyethylpentaerythritol tetraacrylate having an average molecular weight from about 450 to about 40,000.

5. A composition according to claim 1 wherein the polyester is a polyoxyethylpentaerythritol tetramethacrylate having an average molecular weight from about 450 to about 40,000.

6. A photopolymerizable element comprising a support bearing on its surface a solid layer of a photopolymerizable composition comprising (1) a macromolecular organic polymer binder solid at 50° C., (2) an addition polymerizable, branched chain polyol polyester of an alpha-methylene carboxylic acid of 3–4 carbon atoms represented by the formula $$\left[HO\text{-}(\underset{Q}{C}HCH_2O)_m\text{-}\right]_z \quad C_xH_{(2x+2-y-z)} \quad \left[\text{-}(OCH_2\underset{Q}{C}H)_n\text{-}O\overset{O}{\overset{\|}{C}}\text{-}\underset{R}{C}{=}CH_2\right]_y$$

free hydroxyl chain end | polyhydric alcohol carbon skeleton | alkylene oxide chain extender | addition polymerizable ester chain end wherein Q is a member selected from the group consisting of H, $CH_3$ and $C_2H_5$, R is a member selected from the group consisting of H and $CH_3$, $x$ is a cardinal number selected from the group consisting of 3, 4, 5 and 6, being equal to or greater than $y+z$, $y$ is a cardinal number selected from the group consisting of 2, 3, 4, 5 and 6, $z$ is a cardinal number selected from the group consisting of 0, 1, 2, 3, and $y+z$ is greater than 2, $m$ is a cardinal number selected from the group consisting of 0, 1 and more, $n$ is a cardinal number selected from the group consisting of 1 and more, said polyesters being further characterized in that $ny+mz$ is greater than 6 but not greater than 500, and (3) an addition polymerization initiator activatable by actinic radiation.

7. An element according to claim 6 wherein said support is a flexible sheet.

References Cited

UNITED STATES PATENTS

| | | | |
|---|---|---|---|
| 2,755,303 | 7/1956 | Schnell et al. | 260—486 |
| 2,996,538 | 8/1961 | Dijk et al. | 260—486 |
| 3,041,371 | 6/1962 | Goldsmith et al. | 260—486 |
| 3,060,024 | 10/1962 | Burg et al. | 96—28 |
| 3,261,686 | 7/1966 | Celeste et al. | 96—115 |

NORMAN G. TORCHIN, *Primary Examiner.*

J. TRAVIS BROWN, *Examiner.*

R. H. SMITH, *Assistant Examiner.*